United States Patent [19]

Jordan

[11] 4,308,585
[45] Dec. 29, 1981

[54] ELECTRONIC MEMORY UNIT

[75] Inventor: Christopher Jordan, High Wycombe, England

[73] Assignee: J. J. Lloyd Instruments, Ltd., Southampton, England

[21] Appl. No.: 81,031

[22] Filed: Oct. 1, 1979

[30] Foreign Application Priority Data

Oct. 2, 1978 [GB] United Kingdom ............... 38852/78

[51] Int. Cl.³ ...................... H03K 13/02; G06F 13/02
[52] U.S. Cl. ............................. 364/520; 340/347 AD; 364/179
[58] Field of Search ............................ 364/520, 112; 340/347 AD; 360/32; 178/18, 19

[56] References Cited

U.S. PATENT DOCUMENTS

| | | | |
|---|---|---|---|
| 3,449,742 | 6/1969 | Stapleton | 340/347 AD |
| 3,573,727 | 4/1971 | Freeny | 364/179 |
| 3,629,495 | 12/1971 | Cahill | 360/32 |
| 3,781,871 | 12/1973 | Mattern | 340/347 AD |
| 3,824,387 | 7/1974 | Garst | 364/179 |
| 3,838,445 | 9/1974 | Cupp et al. | 360/32 X |
| 3,855,617 | 12/1974 | Jankowski et al. | 360/32 |
| 4,053,734 | 10/1977 | Yasunaga | 360/32 X |
| 4,161,782 | 7/1979 | McCracken | 364/179 |
| 4,206,476 | 6/1980 | Hashimoto | 360/32 X |

FOREIGN PATENT DOCUMENTS

| | | | |
|---|---|---|---|
| 1255425 | 12/1971 | United Kingdom | 364/179 |
| 561956 | 6/1977 | U.S.S.R. | 364/179 |

Primary Examiner—Felix D. Gruber
Attorney, Agent, or Firm—Baker & McKenzie

[57] ABSTRACT

In an electronic memory unit for processing a pair of transient electrical signals prior to recording by an XY plotter, a random access memory receives digitized samples of the signals at a dynamically variable rate which is determined by the rate of change of the input signals. The said rate is controlled by sampling decision circuits which sense the difference in level between successive samples. The stored samples are read out of the memory to digital-to-analogue converters at a rate which is suited to the characteristics of the XY plotter connected to the outputs of the unit thereby enabling rapidly changing signals fed to the inputs of the unit to be recorded accurately without wasteful use of memory capacity.

11 Claims, 4 Drawing Figures

ELECTRONIC MEMORY UNIT

BACKGROUND OF THE INVENTION

This invention relates to an electronic memory unit intended primarily for use with an XY plotter to record transient electrical signals.

The measurement and recording of transients is an important requirement in many scientific and engineering fields. Frequently it is necessary to record one transient time-varying signal as a function of another related time-varying signal, as may be required for example in carrying out tests on structural materials or when monitoring chemical reactions. A problem commonly associated with test signals of a transient nature is that the signals may exhibit relatively high rates of change during one important brief portion of the test period, and relatively low rates of change at other times,. If, under these circumstances, an XY plotter is used to plot the curve, the mechanical limitations of the plotter, specifically the speed at which it can respond to input signals, often prevent the accurate recording of that brief portion of the curve when the signals are changing rapidly. One method which has been used to overcome this disadvantage is first of all to record the test electronically by storing the two variables as functions of time with an instrument employing a digital memory. This instrument is set to record the signals with a fixed sampling rate throughout the test, the sampling process being initiated, or triggered, when the initial edge of one of the signals is detected. When the test has been completed, the instrument may then be set to "play back" the signals at a sufficiently slow rate to enable the XY plotter to follow the rapidly changing parts of the signals. The above method is however wasteful of the memory capacity. The sampling rate must be chosen to be sufficiently fast to reproduce the portion of rapid change accurately, but at other times this rate is unnecessarily high since the signals are varying much less rapidly. In most cases, due to a limitation on memory capacity, a compromise has to be made in choosing the sampling rate-between a rate which is fast enough for satisfactory resolution and one which is slow enought to enable the storing of the whole test period without running out of memory capacity. Furthermore, the method is relatively complicated to carry out in that the operator must set the sampling rate, the duration of the sampling process and the triggering system; also when the test is completed the instrument has to be switched over to the playback mode.

SUMMARY OF THE INVENTION

According to this invention a method for storing at least one time-varying electrical signal in an electronic memory device includes the steps of:
sampling the signal;
converting the sample values to digital form at a rate dependent on the rate of change of the signal level; and
writing the digitized values into the memory. This variation in conversion and write-in rate may be achieved by monitoring the level of an input signal and causing a sample or a series of samples of the signal to be taken when the signal level changes by a pre-determined amount from the level of the signal which existed when the previous sample or series of samples was taken.

In a preferred method, two input signals are sampled simultaneously at the same rate, samples of both signal levels being taken whenever either signal level exceeds its level at the previous sampling moment by a predetermined incremental value. The sample values are then converted to a digital form and entered into an electronic memory. Under normal operating conditions, the rate at which successive digital sample values are entered into the memory is equal to the rate at which the two input signals are sampled. At the same time as sample values are being entered, previously entered values are read out from the memory for subsequent conversion to analogue form, and then fed to a recording instrument such as an XY plotter. The rate at which sample values can be read out of the memory is limited by the speed of response of the recording instrument, and in general lies between the maximum and minimum anticipated sampling rates. The reading out takes place continuously, and it therefore follows that if, at a given moment, the sampling rate is faster than the read-out rate the number of sample values stored in the memory is increasing, and conversely if the sampling rate is lower than the readout rate then the number of stored values is decreasing.

According to another aspect of this invention an electronic memory unit comprises: (i) an input signal sampling stage which is operable to sample a time-varying input signal at a sampling rate which is variable and is related to the rate of change of the signal; (ii) an analogue-to-digital conversion stage connected to the sampling stage for converting the sampled values to digital form; (iii) an electronic memory unit which is linked to the analogue-to-digital conversion stage and which is controllable simultaneously to store and read out digitized sample values, the readout rate being different from the rate at which the sampled values are entered for storage; and (iv) a digital-to-analogue conversion stage linked to the memory for converting the values readout from the memory into analogue form.

A preferred embodiment of the memory unit is operable to sample and store two time-varying signals and includes means for sensing incremental changes in both input signals so as to cause the signals to be sampled and converted to digital form when an incremental change of either signal is greater than a pre-determined value.

When the unit is used to process two signals which are to be fed to an XY plotter connected to plot the level of one signal as a function of the other, the effect of increasing the sampling rate when the rate of change of an input signal increases is to produce a plot in which the actual sampling points are approximately equally spaced along the length of the curve. Thus the definition of the recorded curve is approximately constant regardless of the time rates of change of the input signals. The unit allows the full resolving power of the system to be realised continuously (up to a maximum frequency determined by the maximum sampling rate) and also allows efficient use of the memory capacity. The rate at which sample values are read out of the memory and fed to the recording instrument is determined by the maximum writing speed of the latter. When using the unit with an XY plotter it is advantageous to vary the readout rate and thus the preferred embodiment incorporates a circuit for optimising this rate. This circuit operates by monitoring incremental changes in each output signal and controlling the readout rate to maintain the differential value of at least one of the output signals at a predetermined maximum value. This playback optimisation increases the speed with which the test results are plotted and furthermore enables the recorder to follow the output signals when the rate of change of the input signals increases beyond the point at which the input sampling rate is at its maximum value.

In many situations whether the readout rate is constant, or variable as described above, the continuous and simultaneous readout may enable the display of the test results to be completed at the same time as the test itself is completed. This is possible because although during the faster part of the signal the sample values are being plotted at a slower rate than they are being stored by the memory, the remaining period of the signals are often relatively slow, and it is during this latter period that the plotter "catches up" the input so that the last few samples are plotted at the same time as they are taken.

A further feature of the preferred embodiment is a point-joining circuit which inserts interpolated sample values between the values read out of the memory. This has the effect of smoothing the output signals which would otherwise be in the form of successive step functions, due to their being composed of discrete sample values. Such stepped signals place extra demands on the XY plotter and are therefore preferably avoided.

BRIEF DESCRIPTION OF THE DRAWINGS

The invention will now be described by way of example with reference to the drawings in which.

DESCRIPTION OF THE PREFERRED EMBODIMENT

The unit has two channels, an X-channel and a Y-channel having respective inputs 1X and 1Y to which signals from measurement transducers or other sources are fed. Each channel has a sampling stage 2X, 2Y which is operated in conjunction with an analogue to digital converter (ADC) 3X, 3Y and a sampling decision circuit 4X, 4Y to sample the input signal levels whenever the signal level in either channel compared with the level of the previous sample has changed by more than a predetermined amount. The sampling stage 2X, 2Y holds the sampled value while the ADC 3X, 3Y converts the value to digital form. A separate analogue to digital conversion process is initiated each time a sample is taken. Sampling and conversion of X and Y signals takes place simultaneously and the digitized sample values are then entered into memory 6 via data latches 5X, 5Y and the data bus 7.

In this example the memory 6 is a random access memory employing static MOS memory devices having a total capacity of 2048 words, and is organised to provide 1024 words capacity for each channel. Information is transferred to and from locations in the memory 6 under the direction of a control logic circuit 8 including three counters; a write address counter, a read address counter and a memory status counter. The write address counter is incremented whenever a sample is written into the memory, and the read address counter is incremented whenever a sample is read out of the memory. The third counter, the memory status counter, is incremented when the write address counter is incremented, and decremented when the read address counter is incremented. Thus the count of the memory status counter is equal to the number of memory locations storing data at any given time and can therefore be used to indicate when the memory is full or empty.

Stored sample values are read out of the memory 6 at a rate which is compatible with the writing speed of an XY plotter (not shown) connected to the outputs 12X and 12Y of the unit via the data bus 7, latches 9X and 9Y, digital to analogue converters (DAC's) 10X and 10Y, and interpolation circuits 11X and 11Y.

Figure 2:
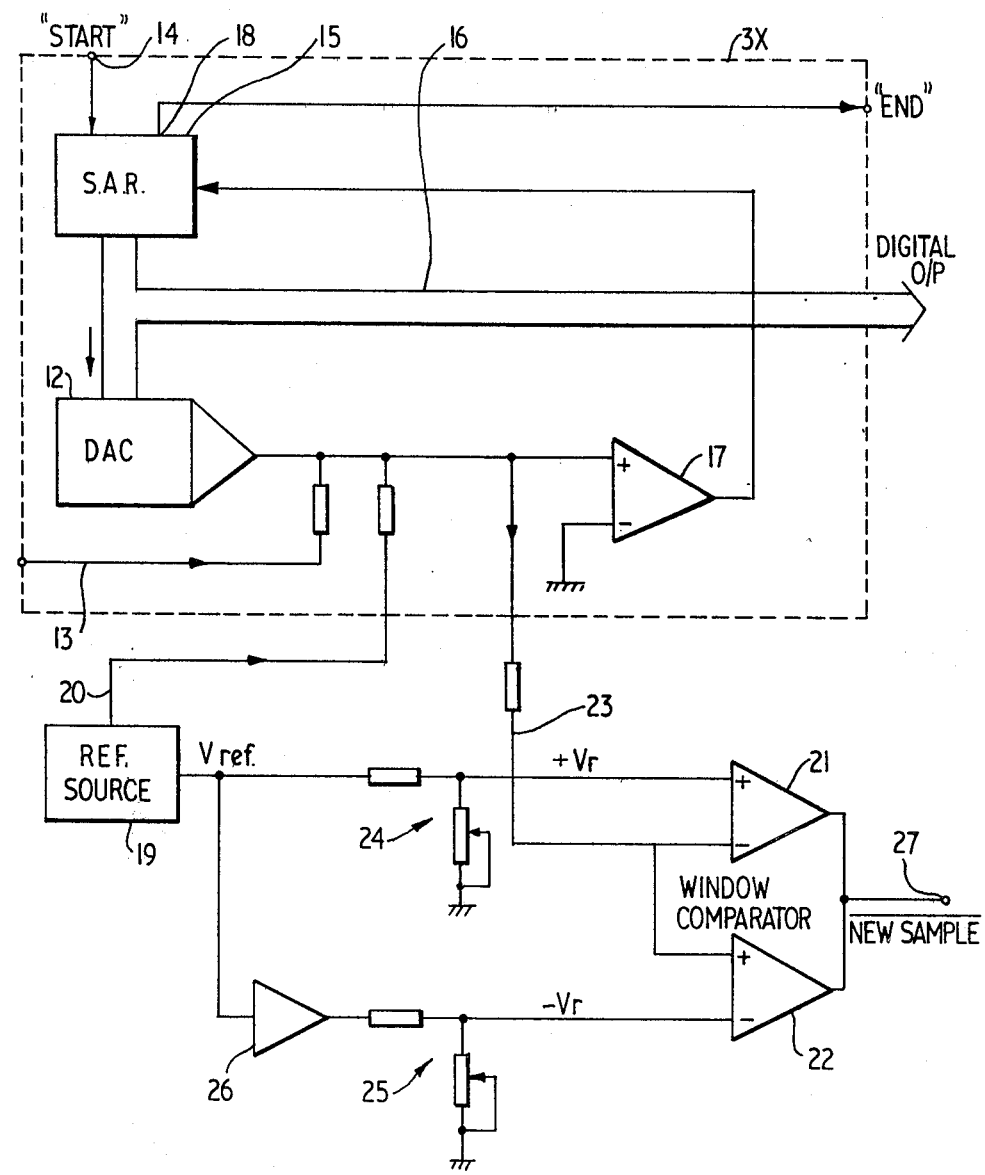
FIG. 2 is a circuit diagram of the analogue to digital converter circuit and sampling decision circuit for one channel of the memory unit of FIG. 1.

Referring to FIG. 2, the analogue to digital converters 3X and 3Y use the successive approximation technique whereby conversion takes place one bit at a time by comparing the output of a digital to analogue converter 12 with the unknown input voltage fed from the sample and hold circuit 2X on line 13. The conversion process is initiated by a "start" signal, at the input 14 from the control logic, which is applied to a successive approximation register 15 to generate a 10-bit digital signal on the data bus 16. Conversion continues so long as there is a difference between the output level from the DAC 12 and the input analogue signal, as detected by the comparator 17 connected to the successive approximation register 15. When conversion is complete a pulse appears at the output 18 and is fed to the control logic to initiate a write cycle.

The reference source 19 provides an offset current to the comparator via line 20 and also generates a reference voltage for the sampling decision circuitry (4X, 4Y in FIG. 1) which monitors the difference between the DAC output and the signal from the sample and hold circuitry as a means of determining the difference in level between the last converted sample and a new incoming sample. The sampling decision circuit comprises a "window" comparator in the form of two comparator devices 21 and 22, the inverting input of comparator 21 and the non-inverting input of comparator 22 being connected to receive the difference signal via the line 23. The reference voltage from the source 19 is fed to two variable voltage dividers 24 and 25, in one case via an inverting amplifier 26, to generate low level positive and negative reference voltages $+V_r$ and $-V_r$ which are applied to the other inputs of the comparators 21 and 22. Whenever the magnitude of the difference signal on line 23 is greater than $/V_r/$, the $\overline{\text{NEW SAMPLE}}$ output 27 goes low and a new sampling and conversion process is initiated via the control logic circuitry.

Figure 3:
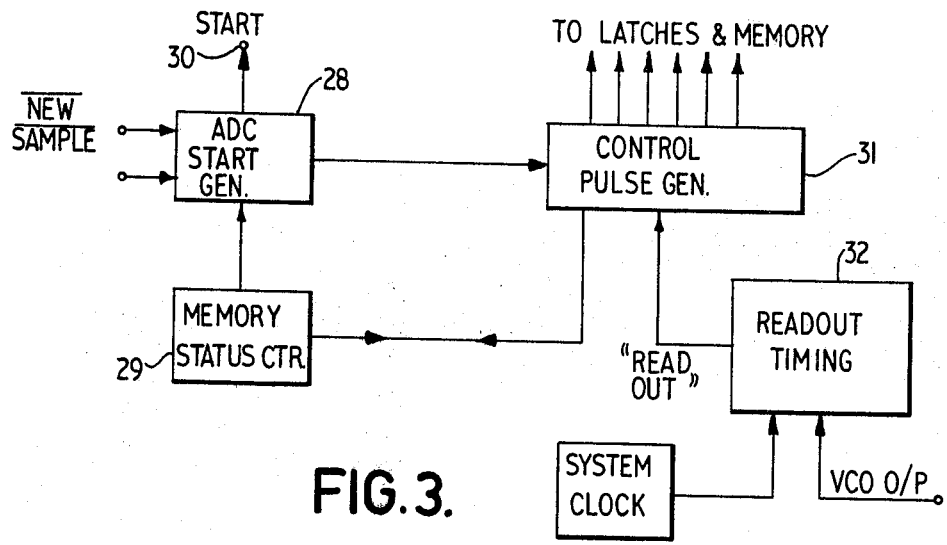
FIG. 3 is a block diagram of part of the control logic circuit of FIG. 1.

The circuitry shown in FIG. 2 is identical for both X and Y channels and the $\overline{\text{NEW SAMPLE}}$ outputs of both sample decision circuits 4X and 4Y are connected to the control logic circuit 8 so that whenever the difference between successive sample values in either channel is greater than a predetermined value, a new conversion process is initiated. This is accomplished as shown in FIG. 3 by stages within the control logic circuit 8. An analogue to digital conversion (ADC) "start" generator 28 receives the $\overline{\text{NEW SAMPLE}}$ signals from the sampling decision circuits, together with a signal from the memory status counter 29. The latter is a counter which is incremented whenever a pair of samples is written into the memory and decremented whenever a pair of samples is read out of the memory. The connection between this counter and the ADC start generator serves to carry a "memory full" signal when all the storage locations of the memory are occupied, which signal prevents a "START" signal appearing at the output 30. Thus, under normal circumstances, when there is storage space available in the memory, a "START" signal is fed via input 14 (see FIG. 2) to both analogue to digital converters 3X and 3Y to initiate a new conversion process. If the memory is full, the "START" signal is inhibited until a pair of samples is read out of the memory, and further conversion and storage occurs at a rate equal to the readout rate until the rate of change of the input signals begins to fall.

When the analogue to digital conversion cycle is complete, the ADC start generator 28 feeds a signal to a control pulse generator 31 which carries out a write cycle whereby the latches 5X and 5Y are operated and the converted pair of samples is stored in the correct locations of the memory 6.

Data readout is carried out at a suitable rate by a read cycle comprising a series of timing signals generated by the timing period generator 32 and the control pulse generator 31 to control the transfer of successive stored sample values from the correct location in the memory 6 to the DAC's 10X and 10Y. Read cycles are only initiated when the memory is not empty (as indicated by the memory status counter). If the memory 6 is empty, then the data fed to the DAC's 10X and 10Y corresponds to data transmitted by the ADC's 3X and 3Y.

The sampling rate, the readout rate, and the control of writing and readout to and from the memory 4, are such that the operation of the unit can be divided into four possible states:

(i) When the input signals at 1X and 1Y are slow, the sampling rate is low and the memory 6 remains empty. In this state sampled values are fed to the outputs 12X and 12Y without significant delay.

(ii) When the input signals are too fast for direct plotting by the XY plotter, the memory 6 starts to fill. At the same time data is clocked out of the memory at a readout rate compatible with the maximum writing speed of the plotter.

(iii) If the input signals subsequently slow down again, the memory 6 continues to empty and the input becomes effectively directly coupled to the output when the memory status counter indicates that the memory 6 is empty.

(iv) If the input signals exhibit rapid changes for more than a certain time, the memory becomes full and the control logic circuits 8 cause the input signals to be converted at the same rate as samples are being read out. Under these conditions the definition of the recorded signals will be impaired. Naturally, however, if the input signals slow down, the memory 6 will start to empty and normal operation will resume.

Samples read out of the memory 6 are passed along the data bus 7 via latches 9X and 9Y to digital to analogue converters 10X and 10Y. The converters 10X and 10Y are conventional and are not shown in detail.

The analogue signals from the DAC's are then fed to interpolation circuits 11X and 11Y which add extra sample values between successive samples to eliminate discontinuities generated by the sampling process and which would otherwise place extra demands on the XY plotter. The use of interpolation also improves the appearance of the plotted curve.

Figure 4:
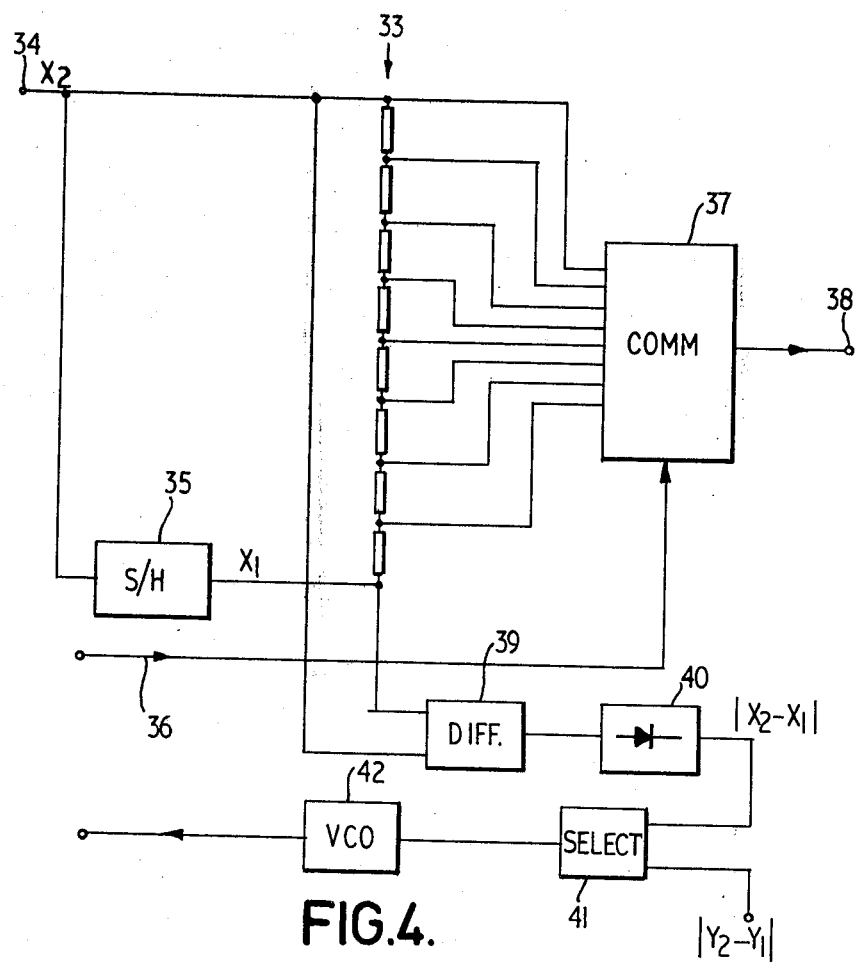
FIG. 4 is a block diagram of an interpolation circuit and readout rate control circuit.

Referring to FIG. 4, which shows an interpolation circuit for the X-channel, a chain 33 of 8 resistors is connected between the output of the DAC 10X (connected to point 34 in FIG. 4) and the output of a sample and hold circuit 35. The latter, controlled via the line 36 from the readout timing period generator 32 (see FIG. 3) so as to take a new sample every time a sample is read out of the memory 6, feeds the sample value $X_1$ to the lower end of the resistor chain 33. The next sample $X_2$ from the digital-to-analogue converter 10X appears simultaneously at the top of the resistor chain and a voltage corresponding to one eighth of the difference $X_2-X_1$ is present across each resistor in the chain. The resistor junctions are connected to a semiconductor commutator switch device 37 which, in response to the readout timing signals from the control logic circuit 8, successively connects each junction of the chain to the output 38 (starting at the lower end of the chain), thereby generating a linear succession of sample values between the two values $X_2$ and $X_1$.

Figure 1:
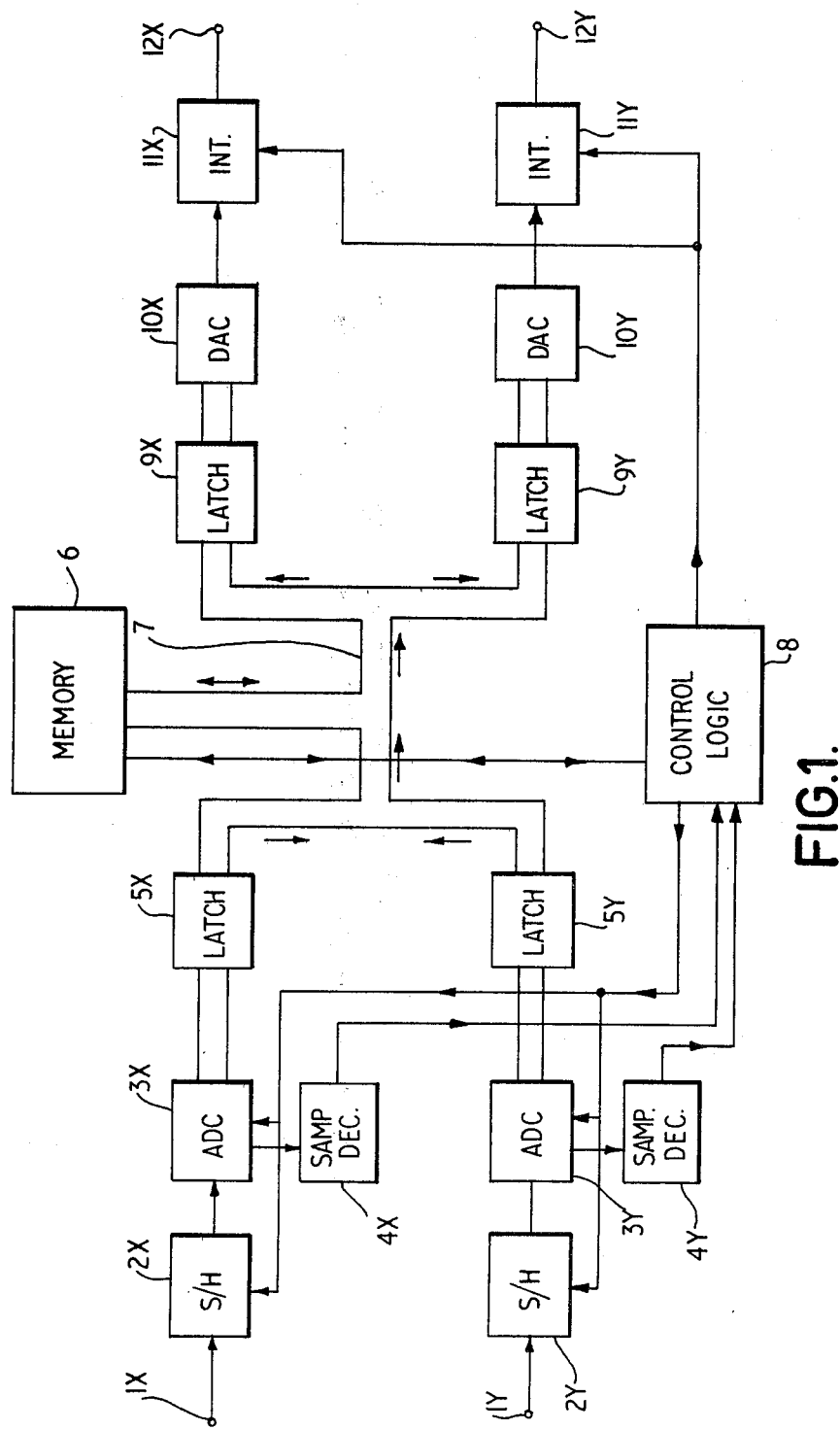
FIG. 1 is a block diagram of a memory unit capable of processing two time-varying input signals.

FIG. 4 also includes a feature not shown in the main block diagram FIG. 1, whereby the rate of change of the output signals from the DAC's 10X and 10Y can be used to control the readout rate from the memory. A subtraction stage 39 subtracts the two adjacent sample values $X_2$ and $X_1$ and then feeds the resulting voltage to a precision rectifier 40 to generate a single polarity difference voltage $/X_2-X_1/$. This voltage is presented to one input of a selection stage 41 which also receives the corresponding difference voltage $/Y_2-Y_1/$ from the Y-channel. The greater of the two difference voltages $/Y_2-Y_1/$ or $/X_2-X_1/$ is selected and used to control a voltage-controlled oscillator 42 whose output is connected to the readout timing circuits in the control logic 8 (see FIG. 3). The VCO 42 is arranged such that its frequency decreases when the difference between adjacent samples is large. This, in turn, decreases the readout and interpolation rates thereby slowing the pen movememt of the XY plotter during periods of rapid signal level change. It will be appreciated that this slowing of the readout rate will normally occur when the differences between corresponding adjacent samples in the input circuits of the unit exceed the threshold of the sampling decision circuits 4X, 4Y, as occurs when the rate of change of the input signals exceeds that required to drive the sampling circuits at their maximum sampling rate or when the memory is full.

The interpolation technique described above can be carried out twice if required by connecting a second virtually identical circuit to the output of the first interpolation circuit, the only difference being that the timing signals applied to the commutating switch of the second circuit have to be eight times as fast as those for the first circuit. Two $\frac{1}{8}$th increment interpolation circuits connected in series would produce an output signal in which the period between each sample fed to the XY plotter is 1/64th of the period between samples read out of the memory.

This interpolation technique is carried out on analogue signals and effectively produces a straight line between pairs of adjacent readout samples. More sophisticated interpolation techniques can be carried out digitally, before the output signals from the memory are fed to the DAC's, using for example a microprocessor. In this case more complex mathematical interpolation processes may be employed, based on for instance cubic or sin x/x functions, several adjacent samples in the memory being evaluated simultaneously.

It is a feature of the preferred embodiment that the control logic circuit 8 incorporates means enabling the operator to use the unit as a conventional transient memory recorder. In this mode the unit samples one or both input signals at a constant rate. The stored values are read out from the memory after the test has been completed. The duration of the test period is of course limited by the capacity of the memory since entry and readout are not simultaneous. In the case of single channel operation the memory can be organised so that the full 2048 word capacity can be used for storing values from one channel.

The two channel unit described above is primarily intended for use in the plotting of one time-varying signal against another. Use of the unit as a conventional recorder as described in the previous paragraph enables slow playback of one or two signals for plotting as a function of time after the test has been completed.

A further possibility is the use of the unit to record one signal as a function of time whilst retaining the advantage of simultaneous playback. This can be achieved by feeding the test signal to the X-input and a ramp function signal to the Y-input with the unit operating in its variable sampling rate mode.

The invention also includes the use of the unit in conjunction with a chart recorder to record a single time-varying signal containing transients which would normally exceed the maximum writing speed of the recorder. Many modern recorders use digital stepping motors for driving the paper, and therefore allow the paper speed to be controlled directly by digital signals read out of the unit's memory. In this application of the unit the time-varying signal would be fed to the Y-input of the unit, the digital section of the X-channel being used to store timing information related to time interval between each successive sample carried out in the Y-channel. Thus the memory would contain pairs of samples each comprising (i) a digitized sample value of the signal fed to the Y-input and (ii) timing information related to the time difference between that sample and the previous sample. On readout, the timing information is fed to the motor control circuits of the chart recorder (a) to slow the paper speed when the time difference between adjacent samples is small, and (b) to simultaneously slow the readout rate from the memory. This enables a fast transient to be recorded without loss of accuracy due to the speed limitations of the recorder.

What is claimed is:

1. A method of processing at least one time varying electrical signal, the method including the steps of:
   sampling the signal to provide a succession of sample values;
   sensing a rate of change of the signal;
   converting the sample values to digital form;
   writing the digitized sample values into an electronic memory device at a writing rate; and
   simultaneously reading out previously stored sample values from the memory at a rate which is different from the writing rate;
   said writing rate being automatically variable in response to the sensed rate of change of the signal.

2. A method according to claim 1, wherein the conversion of sample values into digital form is performed repetitively at the same rate as the writing rate.

3. A method for recording two time-varying electrical signals in the form of a graph in which the level of one signal is plotted as a function of the level of the other, the method including the steps of:
   (i) sampling both signals at a single, variable sampling rate, which rate is increased in response to an increase in the rate of change of either of the said signals;
   (ii) converting the samples of both signals to a digital form;
   (iii) writing the digital sample values into the memory;
   (iv) simultaneously with steps (i) to (iii) above, reading out stored sample values from the memory at a readout rate which is different from the said sampling rate;
   (v) converting the read out sample values into two analogue output signals representing the two time-varying electrical signals; and
   (vi) feeding the output signals to a recording instrument, whereby the recording element of the instrument moves in an X direction in response to the level of one of the output signals, and in a perpendicular Y direction in response to the level of the other output signal.

4. A method according to claim 3 wherein the readout rate is variable in response to the rate of change of at least one of the output signals.

5. A method according to claim 4 wherein the time differential of each output signal is monitored and the readout rate is varied in response to the monitored differential values to maintain at least one of the differential values at or near a predetermined maximum value.

6. A method according to claim 3 wherein the output signals comprise sample values read out from the memory and converted to analogue form together with interpolated values inserted between the said sample values.

7. A method according to claim 6 wherein sample values read out from the memory are converted to analogue form, voltages corresponding to a current sample $X_i$ and the previous sample $X_{i-1}$ being fed to respective ends of a potential divider chain to generate a linear series of intermediate interpolation values which are sequentially fed to the output of the respective channel of the unit between the sample values read out of the memory.

8. An electronic memory unit comprising:
   (i) input signal sampling means for sampling a time-varying input signal;
   (ii) analogue-to-digital conversion means connected to the sampling means for converting the samples into digital form;
   (iii) difference determining means for determining the incremental difference in level between adjacent sample values;
   (iv) an electronic memory stage linked to the analogue-to-digital conversion means and controllable simultaneously to store and read out digitized sample values, the rate of storing samples being controlled automatically by the said difference determining means and related to the rate of change of the input signal, and the readout rate being different from the rate at which samples are entered for storage; and
   (v) digital-to-analogue conversion means linked to the electronic memory stage for converting the values read out from the electronic memory stage into analogue form.

9. A memory unit according to claim 8, wherein:
   (i) the sampling means includes a pair of sampling circuits, each circuit being arranged to sample a respective one of two time-varying input signals at the same sampling rate;

(ii) the analogue-to-digital conversion means includes a pair of analogue-to-digital converters arranged to perform a conversion cycle each time a signal received from the difference determining means indicates that either one of a pair of samples generated by the sampling means exceeds the corresponding previous sample by more than a predetermined amount; and (iii) the digital-to-analogue conversion means includes two digital-to-analogue converters arranged to generate two output signals representing the two input signals.

10. A memory unit according to claim 8, including control logic means for monitoring the number of storage locations in the electronic memory stage which are storing data, and which is connected to the analogue-to-digital conversion means to limit the sampling rate when the electronic memory stage is full.

11. A memory unit according to claim 9, in combination with an XY plotter, wherein said two digital-to-analogue converters have outputs, said memory unit further including a readout rate control means coupled to the outputs of the two digital-to-analogue converters for monitoring differential values of converted sample values, and coupled via control logic to the electronic memory stage to decrease the readout rate when the difference between adjacent readout sample values is large, whereby to maintain the rate of change of at least one of the output signals from the unit values at or near a maximum predetermined value.

* * * * *